US012516414B2

(12) United States Patent
Zhang et al.

(10) Patent No.: US 12,516,414 B2
(45) **Date of Patent: *Jan. 6, 2026**

(54) REACTOR MANIFOLDS

(71) Applicant: ASM IP HOLDING B.V., Almere (NL)

(72) Inventors: Shuyang Zhang, Chandler, AZ (US); Jereld Lee Winkler, Gilbert, AZ (US); Ankit Kimtee, Phoenix, AZ (US); Eric James Shero, Phoenix, AZ (US); Mimoh Kwatra, Gilbert, AZ (US); Dinkar Nandwana, Chandler, AZ (US); Todd Robert Dunn, Cave Creek, AZ (US); Carl Louis White, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 629 days.

This patent is subject to a terminal disclaimer.

(21) Appl. No.: 18/045,419

(22) Filed: Oct. 10, 2022

(65) Prior Publication Data

US 2023/0069359 A1 Mar. 2, 2023

Related U.S. Application Data

(63) Continuation-in-part of application No. 16/813,527, filed on Mar. 9, 2020, now Pat. No. 11,492,701.

(Continued)

(51) Int. Cl.
*C23C 16/455* (2006.01)

(52) U.S. Cl.
CPC .. *C23C 16/45544* (2013.01); *C23C 16/45561* (2013.01)

(58) Field of Classification Search
CPC .......... C23C 16/4409; C23C 16/45527; C23C 16/45544; C23C 16/54; C23C 16/45561;

(Continued)

(56) References Cited

U.S. PATENT DOCUMENTS 1,523,156 A 1/1925 Adams
1,853,045 A 4/1932 Gnau (Continued)

FOREIGN PATENT DOCUMENTS

CN 101117308 2/2008
CN 104561937 4/2015

(Continued)

OTHER PUBLICATIONS

Baxter et al., "Chemical vapour deposition of electrochromic tungsten oxide films employing volatile tungsten(v1) 0x0 alkoxide/β-diketonate complexes", Chem. Commun., 1996, pp. 1129-1130.

(Continued)

*Primary Examiner* — Jeffrie R Lund

(74) *Attorney, Agent, or Firm* — Snell & Wilmer L.L.P.

(57) ABSTRACT

Herein disclosed are systems and methods related to semiconductor processing device including a manifold including a bore configured to deliver a gas to a reaction chamber, the manifold including a first block mounted to a second block, the first and second mounted blocks cooperating to at least partially define the bore. The manifold may further comprise an insulator cap disposed about the first block or the second block. The semiconductor processing device may comprise at least three valve blocks mounted to the second block so that a precursor backflow is prevented. Heater rod(s) can extend through the second block to a location adjacent the first block.

19 Claims, 8 Drawing Sheets

Related U.S. Application Data

(60) Provisional application No. 62/820,711, filed on Mar. 19, 2019.

(58) Field of Classification Search
CPC ........ C23C 16/45512; C23C 16/45574; C23C 16/4408; C23C 16/45548; C23C 16/45565; H01L 21/67017
See application file for complete search history.

(56) References Cited

U.S. PATENT DOCUMENTS 3,429,903 A 2/1969 Larson
3,784,631 A 1/1974 Menapace et al.
3,882,934 A 5/1975 Knoos et al.
3,913,617 A 10/1975 van Laar et al.
4,222,671 A 9/1980 Gilmore
4,401,052 A 8/1983 Baron et al.
4,410,281 A 10/1983 Crookes
4,422,773 A 12/1983 Cassaday et al.
4,649,859 A 3/1987 Wanlass
4,747,367 A 5/1988 Posa
4,828,224 A 5/1989 Crabb et al.
4,869,284 A 9/1989 Scott et al.
4,889,609 A 12/1989 Cannella
4,895,107 A 1/1990 Yano et al.
4,907,534 A 3/1990 Huang et al.
4,949,783 A 8/1990 Lakios et al.
4,951,601 A 8/1990 Maydan et al.
4,990,047 A 2/1991 Wagner et al.
5,004,374 A 4/1991 Grey
5,028,724 A 7/1991 Ivankovits et al.
5,071,460 A 12/1991 Fujiura et al.
5,080,549 A 1/1992 Goodwin et al.
5,106,453 A 4/1992 Benko et al.
5,121,705 A 6/1992 Sugino
5,131,627 A 7/1992 Kolenc
5,166,092 A 11/1992 Mochizuki et al.
5,186,718 A 2/1993 Tepman et al.
5,192,371 A 3/1993 Shuto et al.
5,199,483 A 4/1993 Bahng
5,217,501 A 6/1993 Fuse et al.
5,223,001 A 6/1993 Saeki
5,229,615 A 7/1993 Brune et al.
5,248,253 A 9/1993 Philipossian et al.
5,252,131 A 10/1993 Kiyama et al.
5,284,519 A 2/1994 Gadgil
5,286,296 A 2/1994 Sato et al.
5,288,327 A 2/1994 Bhat
5,350,453 A 9/1994 Scholosser
5,388,944 A 2/1995 Takanabe et al.
5,391,035 A 2/1995 Krueger
5,405,446 A 4/1995 Nakajima et al.
5,433,785 A 7/1995 Saito
5,451,258 A * 9/1995 Hillman ............. C23C 16/4485 118/724
5,462,397 A 10/1995 Iwabuchi
5,488,925 A 2/1996 Kumada
5,516,732 A 5/1996 Flegal
5,520,742 A 5/1996 Ohkase
5,520,743 A 5/1996 Takahashi
5,525,157 A 6/1996 Hawkins et al.
5,538,390 A 7/1996 Salzman
5,571,330 A 11/1996 Kyogoku
5,586,585 A 12/1996 Bonora et al.
5,601,651 A 2/1997 Watabe
5,609,459 A 3/1997 Muka
5,728,223 A 3/1998 Murakami et al.
5,755,878 A 5/1998 Habuka et al.
5,789,027 A 8/1998 Watkins et al.
5,846,330 A 12/1998 Quirk et al.
5,851,294 A 12/1998 Young et al.
5,885,358 A 3/1999 Maydan et al.
5,893,641 A 4/1999 Garcia
5,938,840 A 8/1999 Habuka et al.
5,951,771 A 9/1999 Raney et al.
6,036,783 A 3/2000 Fukunaga et al.
6,070,550 A 6/2000 Ravi et al.
6,079,353 A 6/2000 Leksell et al.
6,110,529 A 8/2000 Gardiner et al.
6,114,227 A 9/2000 Leksell et al.
6,126,996 A 10/2000 Kirlin et al.
6,217,658 B1 4/2001 Orczyk et al.
6,224,676 B1 5/2001 Nakajima et al.
6,258,157 B1 7/2001 Gordon
6,299,692 B1 10/2001 Ku et al.
6,302,965 B1 10/2001 Umotoy et al.
6,303,501 B1 10/2001 Chen et al.
6,331,072 B1 12/2001 Schierholz et al.
6,375,750 B1 4/2002 van Os et al.
6,387,207 B1 5/2002 Janakiraman et al.
6,416,213 B1 7/2002 Fukunaga
6,482,740 B2 11/2002 Soininen et al.
6,494,957 B1 * 12/2002 Suzuki ................ C23C 16/4485 392/394
6,534,133 B1 3/2003 Kaloyeros et al.
6,539,891 B1 4/2003 Lee et al.
6,660,177 B2 12/2003 Carr
6,783,590 B2 8/2004 Lindfors et al.
6,846,516 B2 1/2005 Yang et al.
6,878,628 B2 4/2005 Sophie et al.
6,881,263 B2 4/2005 Lindfors et al.
6,884,296 B2 4/2005 Basceri et al.
6,899,507 B2 5/2005 Yamagishi et al.
6,905,547 B1 6/2005 Londergan et al.
6,916,398 B2 7/2005 Chen et al.
6,921,712 B2 7/2005 Soininen et al.
7,018,478 B2 3/2006 Lindfors et al.
7,021,881 B2 4/2006 Yamagishi et al.
7,045,060 B1 5/2006 Liles et al.
7,163,587 B2 1/2007 Kinnard et al.
7,175,713 B2 2/2007 Thakur et al.
7,195,037 B2 3/2007 Eidsmore
7,204,886 B2 4/2007 Chen et al.
7,220,669 B2 5/2007 Hujanen et al.
7,297,892 B2 11/2007 Kelley et al.
7,304,263 B2 12/2007 Chang et al.
7,311,851 B2 12/2007 Carr
7,323,581 B1 1/2008 Gardiner et al.
7,402,210 B2 7/2008 Chen et al.
7,408,225 B2 8/2008 Shinriki et al.
7,416,994 B2 8/2008 Quick
7,494,927 B2 2/2009 Kostamo et al.
7,591,907 B2 9/2009 Chen et al.
7,591,957 B2 9/2009 Carr
7,638,645 B2 12/2009 Gordon et al.
7,670,399 B2 3/2010 Park
7,780,785 B2 8/2010 Chen et al.
7,780,789 B2 8/2010 Wu et al.
7,846,499 B2 12/2010 Blomberg
7,918,938 B2 4/2011 Provencher et al.
7,927,942 B2 4/2011 Raaijmakers
8,070,879 B2 12/2011 Chen et al.
8,137,463 B2 3/2012 Liu et al.
8,142,847 B2 3/2012 Shenai-Khatkhate et al.
8,152,922 B2 4/2012 Schmidt et al.
8,188,464 B2 5/2012 Quick
8,197,600 B2 * 6/2012 Nakao ................. C23C 16/4486 261/78.2
8,211,230 B2 7/2012 Verghese et al.
8,298,336 B2 10/2012 Wang et al.
8,372,201 B2 2/2013 Provencher et al.
8,399,056 B2 3/2013 Blasco et al.
8,425,682 B2 4/2013 Wang et al.
8,465,801 B2 6/2013 Schmidt et al.
8,668,776 B2 3/2014 Chen et al.
8,784,563 B2 7/2014 Schmidt et al.
8,809,170 B2 8/2014 Bauer
9,029,189 B2 5/2015 Gordon et al.
9,175,394 B2 11/2015 Yudovsky et al.
9,312,154 B2 4/2016 Tran et al.
9,359,672 B2 6/2016 Verghese et al.
9,388,492 B2 7/2016 White et al.
9,394,608 B2 7/2016 Shero et al.

(56) References Cited

U.S. PATENT DOCUMENTS 9,567,672 B2 2/2017 Kim et al.
9,574,268 B1 2/2017 Dunn et al.
9,802,220 B2 10/2017 Heys et al.
9,863,039 B2 1/2018 Min
9,911,590 B2 3/2018 Dussarrat et al.
10,113,232 B2 10/2018 Wongsenakhum et al.
10,131,984 B2 11/2018 Okada
10,147,597 B1 12/2018 Lee et al.
10,280,509 B2 5/2019 Tzu et al.
10,358,407 B2 7/2019 Hatanpaa et al.
10,370,761 B2 8/2019 Dunn et al.
10,468,291 B2 11/2019 Verghese et al.
10,480,072 B2 11/2019 Shero et al.
10,557,197 B2 2/2020 Lee et al.
10,662,527 B2 5/2020 Marquardt
10,683,571 B2 6/2020 Jdira et al.
10,716,199 B2 7/2020 Zhang et al.
10,741,365 B2 8/2020 Chandrasekharan et al.
10,844,486 B2 11/2020 Shero et al.
10,998,205 B2 * 5/2021 Miyashita ........... C23C 16/4584
11,014,866 B2 5/2021 Hatanpaa et al.
11,047,042 B2 6/2021 McKee et al.
11,414,760 B2 * 8/2022 Um ................... C23C 16/45536
11,492,701 B2 * 11/2022 Nandwana ............. C23C 16/54
2001/0003015 A1 6/2001 Chang et al.
2001/0006093 A1 7/2001 Tabuchi et al.
2001/0054377 A1 12/2001 Lindfors et al.
2002/0007790 A1 1/2002 Park
2002/0072164 A1 6/2002 Umotoy et al.
2002/0081381 A1 6/2002 DelaRosa et al.
2002/0113327 A1 8/2002 Hara
2002/0170674 A1 11/2002 Shapiro
2002/0195055 A1 12/2002 Grant et al.
2003/0008072 A1 1/2003 Lee et al.
2003/0010451 A1 1/2003 Tzu et al.
2003/0019428 A1 1/2003 Ku et al.
2003/0056720 A1 3/2003 Dauelsberg et al.
2003/0070620 A1 4/2003 Cooperberg et al.
2003/0079686 A1 5/2003 Chen et al.
2003/0101938 A1 6/2003 Ronsse et al.
2003/0106643 A1 6/2003 Tabuchi et al.
2003/0172872 A1 9/2003 Thakur et al.
2003/0180460 A1 9/2003 Strauch et al.
2003/0194360 A1 10/2003 Huziwara et al.
2003/0205096 A1 11/2003 Gehner et al.
2004/0016404 A1 * 1/2004 Gregg ....................... F17C 3/02
118/726
2004/0028810 A1 2/2004 Grant et al.
2004/0035358 A1 2/2004 Basceri et al.
2004/0043557 A1 3/2004 Haukka et al.
2004/0113289 A1 6/2004 Toda et al.
2004/0118342 A1 6/2004 Cheng et al.
2004/0144311 A1 7/2004 Chen et al.
2004/0197090 A1 10/2004 Kudo
2004/0217217 A1 11/2004 Han et al.
2004/0221807 A1 11/2004 Verghese et al.
2004/0224504 A1 11/2004 Gadgil
2005/0000428 A1 1/2005 Shero et al.
2005/0000656 A1 1/2005 Carr
2005/0009325 A1 1/2005 Chung et al.
2005/0092247 A1 5/2005 Schmidt et al.
2005/0173068 A1 8/2005 Chen et al.
2005/0208217 A1 9/2005 Shinriki et al.
2005/0241176 A1 11/2005 Shero et al.
2005/0252449 A1 11/2005 Nguyen et al.
2005/0263197 A1 12/2005 Eidsmore
2005/0271812 A1 12/2005 Myo et al.
2006/0053833 A1 3/2006 Martins et al.
2006/0096540 A1 5/2006 Choi
2006/0266289 A1 11/2006 Verghese et al.
2007/0001326 A1 1/2007 Toda et al.
2007/0026147 A1 2/2007 Chen et al.
2007/0081923 A1 4/2007 Choe et al.
2007/0095285 A1 5/2007 Thakur et al.
2007/0098894 A1 5/2007 Verghese et al.
2007/0128864 A1 6/2007 Ma et al.
2007/0187634 A1 8/2007 Sneh
2007/0194470 A1 8/2007 Dedontney
2008/0037968 A1 2/2008 Kaastra
2008/0085226 A1 4/2008 Fondurulia et al.
2008/0102203 A1 5/2008 Wu et al.
2008/0102208 A1 5/2008 Wu et al.
2008/0115740 A1 5/2008 You
2008/0162580 A1 7/2008 Ben Harush
2008/0202416 A1 8/2008 Provencher et al.
2008/0241387 A1 10/2008 Keto
2008/0254218 A1 10/2008 Xinjian et al.
2008/0271610 A1 11/2008 Vedsted et al.
2009/0084317 A1 4/2009 Wu et al.
2009/0095222 A1 4/2009 Tam et al.
2009/0196992 A1 8/2009 Schmidt et al.
2009/0215912 A1 8/2009 Goto et al.
2009/0320754 A1 12/2009 Oya et al.
2010/0003406 A1 1/2010 Lam et al.
2010/0024727 A1 2/2010 Kim et al.
2010/0048032 A1 2/2010 Sangam et al.
2010/0092163 A1 4/2010 Yeung
2010/0150756 A1 6/2010 Chow et al.
2010/0255198 A1 10/2010 Cleary et al.
2010/0266765 A1 10/2010 White et al.
2010/0296800 A1 11/2010 Min et al.
2010/0310772 A1 12/2010 Tsuda
2011/0098841 A1 4/2011 Tsuda
2011/0111136 A1 5/2011 Slevin et al.
2011/0116776 A1 5/2011 Wheeler et al.
2011/0128814 A1 6/2011 Hanada
2011/0199855 A1 8/2011 Hanada
2011/0223334 A1 9/2011 Yudovsky et al.
2012/0079984 A1 4/2012 Schmidt et al.
2012/0289057 A1 11/2012 DeDontney
2012/0307589 A1 12/2012 Hanada
2013/0058835 A1 3/2013 Salazar-Guillen et al.
2013/0061759 A1 3/2013 Laor et al.
2013/0091933 A1 4/2013 Tsukada et al.
2013/0160709 A1 6/2013 White et al.
2013/0206338 A1 8/2013 Tanaka
2013/0333620 A1 12/2013 Li et al.
2013/0333768 A1 12/2013 Chandrasekharan et al.
2014/0120031 A1 5/2014 Yang et al.
2014/0141165 A1 5/2014 Sato et al.
2014/0261178 A1 9/2014 Du Bois et al.
2014/0269156 A1 9/2014 Lane et al.
2014/0284404 A1 9/2014 Kuah et al.
2015/0104161 A1 4/2015 De Mango et al.
2015/0176126 A1 6/2015 Ge et al.
2015/0211112 A1 7/2015 Cadot et al.
2015/0232355 A1 8/2015 Ghaffour et al.
2015/0240359 A1 8/2015 Jdira
2015/0371831 A1 12/2015 Rozenzon et al.
2015/0377481 A1 12/2015 Smith et al.
2016/0108523 A1 4/2016 Lee et al.
2016/0122868 A1 5/2016 Kim et al.
2016/0222508 A1 8/2016 Schoepp et al.
2016/0256889 A1 9/2016 Jones
2016/0281232 A1 9/2016 White et al.
2017/0121818 A1 * 5/2017 Dunn .................. C23C 16/4557
2017/0216796 A1 8/2017 Sameshima
2017/0350011 A1 12/2017 Marquardt
2019/0032206 A1 1/2019 Hodges et al.
2019/0195378 A1 6/2019 Aikawa et al.
2019/0264326 A1 8/2019 Doya
2020/0056286 A1 2/2020 Shero et al.
2020/0248308 A1 * 8/2020 Marquardt .......... H01L 21/0262
2020/0299836 A1 9/2020 Nandwana et al.
2020/0354835 A1 11/2020 Watanabe et al.
2021/0118668 A1 4/2021 Nandwana et al.
2023/0069359 A1 * 3/2023 Zheng ............... C23C 16/45561

FOREIGN PATENT DOCUMENTS

DE 3715644 12/1988
JP H09-186111 7/1997
JP 2002057117 A 2/2002
JP 2008-264640 11/2008

(56) References Cited

FOREIGN PATENT DOCUMENTS

| | | |
|---|---|---|
| JP | 4667541 | 4/2011 |
| JP | 2011-104482 | 6/2011 |
| JP | 2011-104483 | 6/2011 |
| JP | 2011-246466 | 12/2011 |
| JP | 2012-099594 | 5/2012 |
| JP | 2013-075281 | 4/2013 |
| KR | 10-1464173 | 11/2014 |
| KR | 2015-0126789 | 11/2015 |
| KR | 2016-0016622 | 2/2016 |
| WO | WO 90/10092 | 9/1990 |
| WO | WO 1996/40690 | 12/1996 |
| WO | WO 01/29282 | 4/2001 |
| WO | WO 2002/18394 | 3/2002 |
| WO | WO 2008/002546 | 1/2008 |
| WO | WO 2010/047168 | 4/2010 |
| WO | WO 2010/114386 | 10/2010 |
| WO | WO 2014/163742 | 10/2014 |
| WO | WO 2013/111789 | 5/2015 |

OTHER PUBLICATIONS

Bonsu et al., "Synthesis and evaluation of κ2-β-diketonate and β-ketoesterate tungsten(VI) oxo-alkoxide complexes as precursors for chemical vapor deposition of WOx thin films", Dalton Trans., 2016, 45, pp. 10897-10908.

Browning et al., "Atomic layer deposition of MoS2 films", Mater. Res. Express 2, 2015, 6 pages.

Buono-Core et al., "Synthesis and evaluation of bis-β-diketonate dioxotungsten(VI) complexes as precursors for the photodeposition of WO3 films", Polyhedron, 30, 2011, pp. 201-206.

Chisholm et al., "The Molybdenum-Molybdenum Triple Bond. 13.1 Preparations and Characterization of Bis(P-diketonato)tetraalkoxydimolybdenum and -ditungsten Compounds", Inorg. Chem., 1984, 23, pp. 613-618.

Chisholm et al., "Reactions of Metal-Metal Multiple Bonds. 11.1 A Comparison of the Reactivity of M2(OR)6 (M=M) and M2(OR)4(R'COCHCOR')2 (M=M) Compounds (M=Mu, W) with the π-Acid Ligands CO, RC=CR, and RNC", Inorg. Chem., 1984, 23, pp. 1037-1042.

Doyle, "The Reaction of Some Molybdenum and Tungsten Halides with .beta.-Diketones", Inorganic Chemistry, vol. 10, No. 10, 1971, pp. 2348-2350.

Kang et al., "High-mobility three-atom-thick semiconducting films with wafer-scale homogeneity", Nature, Apr. 30, 2015, vol. 520, pp. 656-660.

Lee et al., "Effects of Oxidation State and Crystallinity of Tugsten Oxide Interlayer on Photovoltaic Property in Bulk Hetero-Junction Solar Cell", J. Phys. Chem. 2012, 116, pp. 13480-13487.

Mazurenko et al., "Synthesis, thermal stability, and IR and UV spectra of molybdenum and tungsten β-diketone complexes", Probl. Khim. Primen. β [Beta]-Diketonatov Met., (Mater. Vses. Semin.) (1982).

Zelazowlska et al., "WO3-based electrochromic system with hybrid organic-inorganic gel electrolytes", Journal of Non-Crystalline Solids, 354, 2008, pp. 4500-4505.

* cited by examiner

FIG. 7A
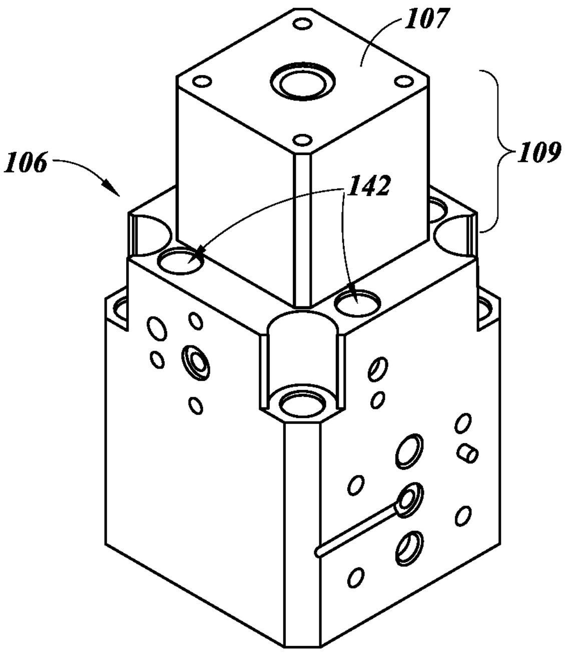
FIG. 8A
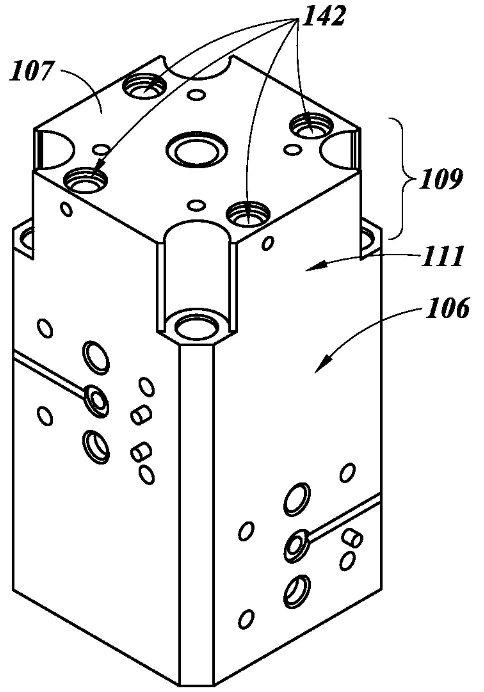
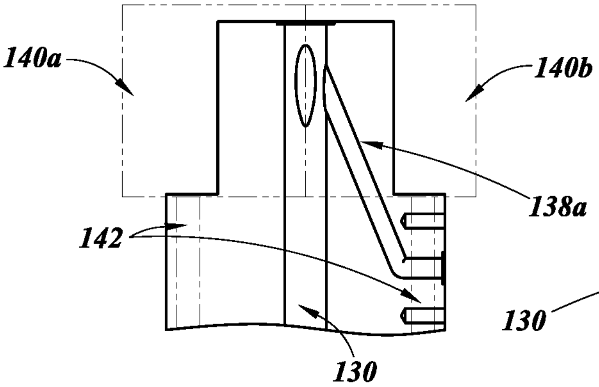
FIG. 7B
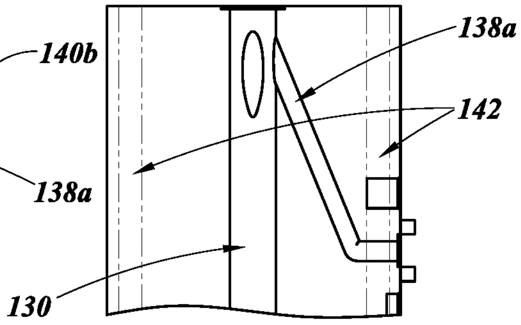
FIG. 8B

REACTOR MANIFOLDS

CROSS-REFERENCE TO RELATED APPLICATIONS

This application is a continuation-in-part of U.S. application Ser. No. 16/813,527, filed on Mar. 9, 2020, now granted, which claims the benefit of priority to U.S. Provisional Application No. 62/820,711, filed Mar. 19, 2019, titled REACTOR MANIFOLDS, the contents of each of which are hereby incorporated by reference herein in their entirety.

BACKGROUND

Field

The field relates generally to manifolds for vapor deposition, and, in particular, to manifolds for improving the quality of deposition in an atomic layer deposition (ALD) reactor.

Description of the Related Art

There are several vapor deposition methods for depositing thin films on surfaces of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Deposition (ALD).

In an ALD process, one or more substrates with at least one surface to be coated are introduced into a deposition chamber. The substrate is heated to a desired temperature, typically above the condensation temperatures of the selected vapor phase reactants and below their thermal decomposition temperatures. One reactant is capable of reacting with the adsorbed species of a prior reactant to form a desired product on the substrate surface. Two, three or more reactants are provided to the substrate, typically in spatially and temporally separated pulses.

In an example, in a first pulse, a first reactant representing a precursor material is adsorbed largely intact in a self-limiting process on a wafer. The process is self-limiting because the vapor phase precursor cannot react with or adsorb upon the adsorbed portion of the precursor. After any remaining first reactant is removed from the wafer or chamber, the adsorbed precursor material on the substrate reacted with a subsequent reactant pulse to form no more than a single molecular layer of the desired material. The subsequent reactant may, e.g., strip ligands from the adsorbed precursor material to make the surface reactive again, replace ligands and leave additional material for a compound, etc. In an unadulterated ALD process, less than a monolayer is formed per cycle on average due to steric hindrance, whereby the size of the precursor molecules prevent access to adsorption sites on the substrate, which may become available in subsequent cycles. Thicker films are produced through repeated growth cycles until the target thickness is achieved. Growth rate is often provided in terms of angstroms per cycle because in theory the growth depends solely on number of cycles, and has no dependence upon mass supplied or temperature, as long as each pulse is saturative and the temperature is within the ideal ALD temperature window for those reactants (no thermal decomposition and no condensation).

Reactants and temperatures are typically selected to avoid both condensation and thermal decomposition of the reactants during the process, such that chemical reaction is responsible for growth through multiple cycles. However, in certain variations on ALD processing, conditions can be selected to vary growth rates per cycle, possibly beyond one molecular monolayer per cycle, by utilizing hybrid CVD and ALD reaction mechanisms. Other variations maybe allow some amount of spatial and/or temporal overlap between the reactants. In ALD and other sequential vapor deposition variations thereof, two, three, four or more reactants can be supplied in sequence in a single cycle, and the content of each cycle can be varied to tailor composition.

During a typical ALD process, the reactant pulses, all of which are in vapor form, are pulsed sequentially into a reaction space (e.g., reaction chamber) with removal steps between reactant pulses to avoid direct interaction between reactants in the vapor phase. For example, inert gas pulses or "purge" pulses can be provided between the pulses of reactants. The inert gas purges the chamber of one reactant pulse before the next reactant pulse to avoid gas phase mixing. To obtain a self-limiting growth, a sufficient amount of each precursor is provided to saturate the substrate. As the growth rate in each cycle of a true ALD process is self-limiting, the rate of growth is proportional to the repetition rate of the reaction sequences rather than to the flux of reactant.

SUMMARY

In one aspect, a semiconductor processing device is provided which includes: a manifold including: a bore configured to deliver a gas to a reaction chamber; a first block mounted to a second block, the first and second mounted blocks cooperating to at least partially define the bore; and a supply channel that provides fluid communication between a gas source and the bore, the supply channel disposed at least partially in the second block. The semiconductor processing device further includes a metallic seal disposed about the bore at an interface between the first and second block.

In some embodiments, the metallic seal is a C seal. The metallic seal can be steel. In some embodiments, the metallic seal can be a W seal. The semiconductor processing device may further include an outlet at a lower portion of the manifold. The supply channel may be angled upwardly away from the outlet and inwardly towards the bore. The first block may include an impingement surface at an upper portion of the manifold, the impingement surface shaped to redirect gas downwardly through the bore to the outlet. The impingement surface and the outlet may be disposed along a longitudinal axis of the bore.

In some embodiments, the semiconductor processing device further includes an insulator cap. The insulator cap may comprise Polytetrafluoroethylene (PTFE) and at least two pieces of members configured to surround the first block. A plurality of heater rods may be arranged in the second block.

In some embodiments, the semiconductor processing device further includes a third block mounted to and below the second block, a second metallic seal between the second and third blocks and at least partially disposed about the bore, where the second and third blocks cooperate to at least partially define the bore. The outlet may be at least partially defined by the third block.

In some embodiments, the second block may comprise a heater rod arranged in the second block. The second block may be configured to accommodate the heater rod extending all the way to the first block to heat the manifold entirely.

In some embodiments, the semiconductor processing device further includes a gas dispersion device downstream of the outlet, the gas dispersion device configured to disperse a flow of the gas into a reaction chamber. The semiconductor processing device may further include the reaction chamber downstream of the gas dispersion device, the reaction chamber configured to receive a substrate. In some embodiments, the semiconductor processing device further includes a valve block mounted to the second block and a second metallic seal disposed between the valve block and the first block, a reactant gas valve mounted to or coupled with the valve block.

In some embodiments, the semiconductor processing device may comprise at least three valve blocks mounted to the second block. Each valve block may be mounted to respective side surfaces of the second block and two of the at least three valve blocks are mounted on the side surfaces opposite to each other being located in a same distance from the impingement surface. One of the at least three valve blocks is mounted closer to the impingement surface than the two of the three valve blocks mounted on the side surfaces opposite to each other.

In another aspect, a semiconductor processing device is provided which includes: a manifold comprising: a bore configured to deliver a gas to a reaction chamber and an impingement surface at an upper portion of the manifold. The semiconductor processing device further includes an outlet at a lower portion of the manifold and a supply channel that provides fluid communication between a gas source and the bore, the supply channel is angled upwardly away from the outlet and inwardly towards the bore, the supply channel oriented to direct gas upwardly towards the impingement surface, and the impingement surface is shaped to redirect gas downwardly through the bore to the outlet. The semiconductor processing device may also comprise an insulator cap mounted to the upper portion of the manifold, the insulator cap comprising a thermally insulating material. The insulator cap may comprise at least two pieces of members comprising Polytetrafluoroethylene (PTFE), which may be configured to surround the upper portion of the manifold. A plurality of heater rods may be arranged in the manifold extending at least partially through the upper portion of the manifold.

In some embodiments, the manifold includes a first block mounted to a second block, the first and second mounted blocks cooperating to at least partially define the bore, the first block includes the impingement surface. The semiconductor processing device may further include a metallic seal disposed at least partially about the bore between the first and second blocks. The impingement surface and the outlet may be disposed along a longitudinal axis of the bore. The semiconductor processing device may further include a showerhead below the outlet, the showerhead configured to laterally disperse a flow of the gas. The semiconductor processing device may further include a reaction chamber below the showerhead, the reaction chamber configured to receive a substrate. In some embodiments, the outlet opens without restriction into a reaction chamber configured to house one or more substrates.

BRIEF DESCRIPTION OF THE DRAWINGS

These and other features, aspects and advantages of the present invention will now be described with reference to the drawings of several embodiments, which embodiments are intended to illustrate and not to limit the invention.

FIG. 7A is a perspective view of the manifold body in accordance with some embodiments of the manifold.

FIG. 7B is a partial sectional view of FIG. 7A.

FIG. 8A is a perspective view of the manifold body in accordance with some embodiments of the manifold.

FIG. 8B is a partial sectional view of FIG. 8A.

DETAILED DESCRIPTION

Figure 1:
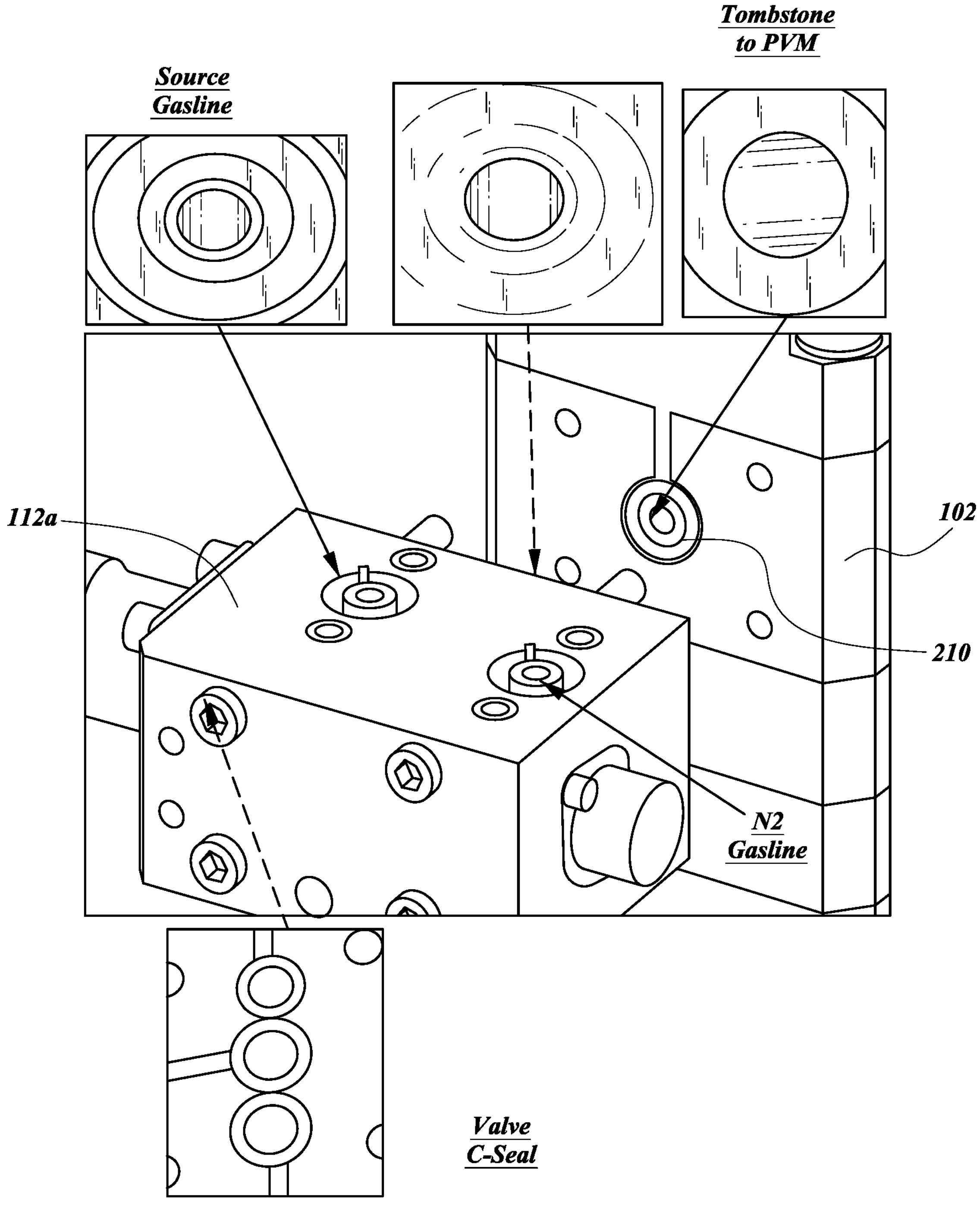
FIG. 1 is an exploded perspective view of an embodiment of a manifold of a semiconductor processing device, with inset images showing magnified portions of the manifold.

The embodiments disclosed herein can be utilized with semiconductor processing devices configured for any suitable gas or vapor deposition process, including processes that alternate reactant exposures (e.g., pulses) to the substrate. For example, the illustrated embodiments show various systems for depositing material on a substrate using atomic layer deposition (ALD) techniques. Among vapor deposition techniques, ALD has many advantages, including high conformality at low temperatures and fine control of composition during the process. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. Removal can be accomplished by a variety of techniques, including purging and/or lowering pressure between pulses. Pulses can be sequential in a continuous flow, or the reactor can be isolated and can backfilled for each pulse. Of course, the equipment disclosed herein can be useful for other vapor deposition processes, particularly those in which alternation of reactants is desired, such that processes employed by the equipment may include some degree of thermal decomposition and/or overlap of precursor spatially or temporally.

Briefly, a substrate is loaded into a reaction chamber and is heated to a suitable deposition temperature, generally at lowered pressure. Deposition temperatures are typically maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved, and processes that allow for either condensation or thermal decomposition can be conducted with equipment described herein.

A first reactant is conducted into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times for a single wafer reactor are from about 0.05 to 20 seconds, particularly between about 1 and 10 seconds, and still more particularly between about 1 and 2 seconds. However, other purge times can be utilized if desired, such as when depositing layers over extremely high aspect ratio structures or other structures with complex surface morphology is needed, or when a high volume batch reactor is employed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition. Moreover, while described as starting with an adsorbing reactant, some recipes may start with the other reactant or with a separate surface treatment, for example to ensure maximal reaction sites to initiate the ALD reactions (e.g., for certain recipes, a water pulse can provide hydroxyl groups on the substrate to enhance reactivity for certain ALD precursors).

As mentioned above, each pulse or phase of each cycle is preferably self-limiting for ALD reactions. An excess of reactant precursors is supplied in each phase to saturate the susceptible structure surfaces. Surface saturation ensures reactant occupation of all available reactive sites (subject, for example, to physical size or steric hindrance restraints) and thus ensures excellent step coverage over any topography on the substrate. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed. While embodiments described herein are particularly advantageous for sequentially pulsed deposition techniques, like ALD and mixed-mode ALD/CVD, the manifold can also be employed for pulsed or continuous CVD processing. Many kinds of reactors capable of ALD growth of thin films, including CVD reactors equipped with appropriate equipment and means for pulsing the precursors, can be employed. In some embodiments a flow type ALD reactor is used, as compared to a backfilled reactor. In some embodiments, the manifold is upstream of an injector designed to distribute gas into the reaction space, particularly a dispersion mechanism such as a showerhead assembly above a single-wafer reaction space.

Many kinds of reactors capable of ALD growth of thin films, including CVD reactors equipped with appropriate equipment and means for pulsing the precursors, can be employed. In some embodiments a flow type ALD reactor is used, as compared to a backfilled reactor. In some embodiments, the manifold is upstream of an injector designed to distribute gas into the reaction space, particularly a dispersion mechanism such as a showerhead assembly above a single-wafer reaction space.

The ALD processes can optionally be carried out in a reaction chamber or space connected to a cluster tool. In a cluster tool, because each reaction space is dedicated to one type of process, the temperature of the reaction space in each module can be kept constant, which improves the throughput compared to a reactor in which is the substrate is heated to the process temperature before each run. A stand-alone reactor can be equipped with a load-lock. In that case, it is not necessary to cool down the reaction chamber or space between each run.

These processes can also be carried out in a reactor designed to process multiple substrates simultaneously, e.g., a mini-batch type showerhead reactor.

Various embodiments disclosed herein relate to a semiconductor device, such as a vapor deposition device (e.g., an ALD device, a CVD device, etc.), that includes a manifold for delivering reactant vapor(s) to a reaction chamber. Regardless of the natural state of the chemicals under standard conditions, the reactant vapors may be referred to as "gases" herein. The embodiments disclosed herein can beneficially provide an effective fluid seal for the bore of the manifold. For example, in various embodiments, metallic seals (e.g., C seals) can be provided between adjacent blocks to inhibit the flow of gas (e.g., air) from the outside environs into the manifold. Moreover, the embodiments disclosed herein can provide an extended mixing length by, e.g., directing reactant gas upwardly through the supply channels at an angle and directing the reactant gases back downwardly through the bore. The disclosed embodiments can accordingly provide improved sealing, extended mixing length, and reduced non-uniformities at the substrate.

FIG. 1 illustrates an exploded view of a valve block 112*a* configured to be mounted to a manifold body 102 of a manifold 100. FIG. 2A is a schematic side sectional view of a semiconductor processing device 10 that can include the manifold 100 to deliver a gas to a reaction chamber (not shown). The semiconductor processing device 10 and manifold 100 shown in FIG. 2A may be generally similar to the semiconductor processing devices and manifolds shown and described in U.S. Pat. No. 9,574,268 and U.S. Patent Publication No. US 2017-0350011, the disclosures of which are incorporated by reference herein in their entirety and for all purposes. There may be various differences between the manifolds described in the U.S. Pat. No. 9,574,268 and U.S. Patent Publication No. US 2017-0350011 and the manifold

100 of FIG. 2A, but the overall functionality and design may be similar to, e.g., FIGS. 6A-6J and/or FIGS. 8A-8F of U.S. Pat. No. 9,574,268 and U.S. Patent Publication No. US 2017-0350011. Furthermore, the manifold of the present disclosure can be combined with the valves of FIG. 2 of U.S. Pat. No. 9,574,268 and U.S. Patent Publication No. US 2017-0350011; and/or combined with the reactant/inert gas sources, gas dispersion mechanism, controller, reaction chamber and vacuum source of FIG. 3A of U.S. Pat. No. 9,574,268 and U.S. Patent Publication No. US 2017-0350011.

The manifold 100 can include the manifold body 102 connected with valve blocks 112*a*, 112*b*, shown on opposite sides of the manifold body 102. Reactant valves and inert gas valves (not shown) are disposed on the blocks 112*a*, 112*b*, or on other upstream blocks (not shown). An inert gas inlet 120 can supply inert gas to the manifold 100, for example, from an upper portion of the manifold 100. The manifold body 102 comprises multiple blocks stacked on one another to at least partially define a bore 130 along which gas(es) flow, including, for example, an upper block 104, an intermediate block 106, and a lower block 108. In the arrangement of FIG. 2A, the intermediate block 106 comprises a sub-block 106*a* and a sub-block 106*b*. The lower block 108 comprises a first sub-block 108*a*, a second sub-block 108*b*, and a third sub-block 108*c*. As explained in U.S. Pat. No. 9,574,268 and U.S. Patent Publication No. US 2017-0350011, the use of multiple blocks and sub-blocks can enable a modular construction of the manifold 100 which can enable the use of internal channels with curved or angled shapes and other internal lumens.

FIG. 2A is a modified version of the manifold described with respect to FIGS. 6A-6J of U.S. Pat. No. 9,574,268 and U.S. Patent Publication No. US 2017-0350011. The sub-blocks 108*a*-108*c* can define an extended mixing length pathway 180 having a first lateral portion 180*a*, an offset axial portion 180*b*, and a second lateral portion 180*b*. The pathway 180 can provide an extended mixing length downstream of where the supply gases are introduced to the bore 130. The manifold 100 can include a plurality of gas distribution channels, including gas distribution channel 136 shown in FIG. 2A. Supply channels 138*a-c* convey gases from the distribution channel 136 to the bore 130. As shown, the supply channels 138*a-c* comprise angled supply channels that are angled downwardly to join the bore 130, where the flow is also downward toward an outlet 132. In the arrangement of FIG. 2A, gas flows through the bore 130, including along the extended mixing length pathway 180, and exits the manifold 100 through the outlet 132. The outlet 132 can be disposed over a dispersion mechanism, such as a showerhead, which can disperse the gas over the substrate in a reaction chamber (not shown).

Although the arrangement of FIG. 2A can beneficially provide an extended mixing length, the extended mixing length pathway 180 and other pathways in the manifold 100 includes curvature and turns which may introduce dead volumes, for example, during purging of reactant gases. The formation of dead volumes can reduce the efficiency and effectiveness of the deposition process. The curved and angled flow pathways of the arrangement shown in FIG. 2A may also create a "throw" onto the substrate. For example, the use of the curved pathway 180 can impart angular momentum to the gas, which can introduce non-uniformities on the substrate.

Moreover, as explained in more detail below in connection with FIG. 3A, and as shown in FIG. 1, the manifold 100 of FIG. 2A utilizes polymeric o-rings 210 (shown in FIG. 2A but labeled in FIGS. 1 and 3A), as seals between adjacent blocks, e.g., between adjacent ones of the vertically stacked blocks 104, 106*a*, 106*b*, 108 and associated sub-blocks, as well as between the laterally adjacent valve blocks 112*a*, 112*b* (also referred to as "tombstones" herein) and the manifold body 102. However, the use of polymeric o-rings may be permeable to gases, such as atmospheric gases entering the manifold 100 from the outside environs. For example, oxygen and/or moisture may penetrate the polymeric o-rings and enter the bore 130, which can contaminate the deposition processes. Further, as shown in FIG. 1, the o-rings 210 can allow oxygen to enter the manifold body 102, which can create a flaky film at the o-ring interface with the manifold body 102.

Figure 2B:
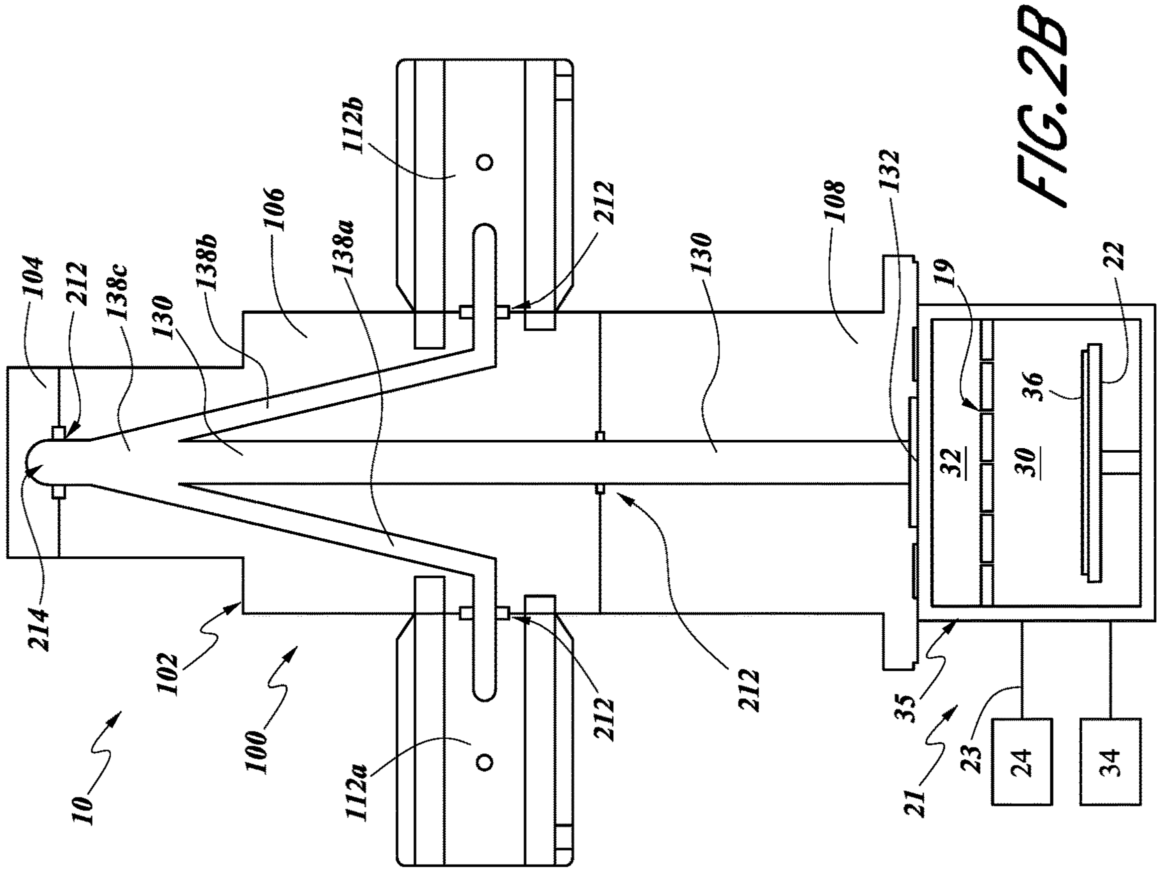
FIG. 2B is a cross sectional view of an embodiment of a semiconductor processing device.
Figure 2A:
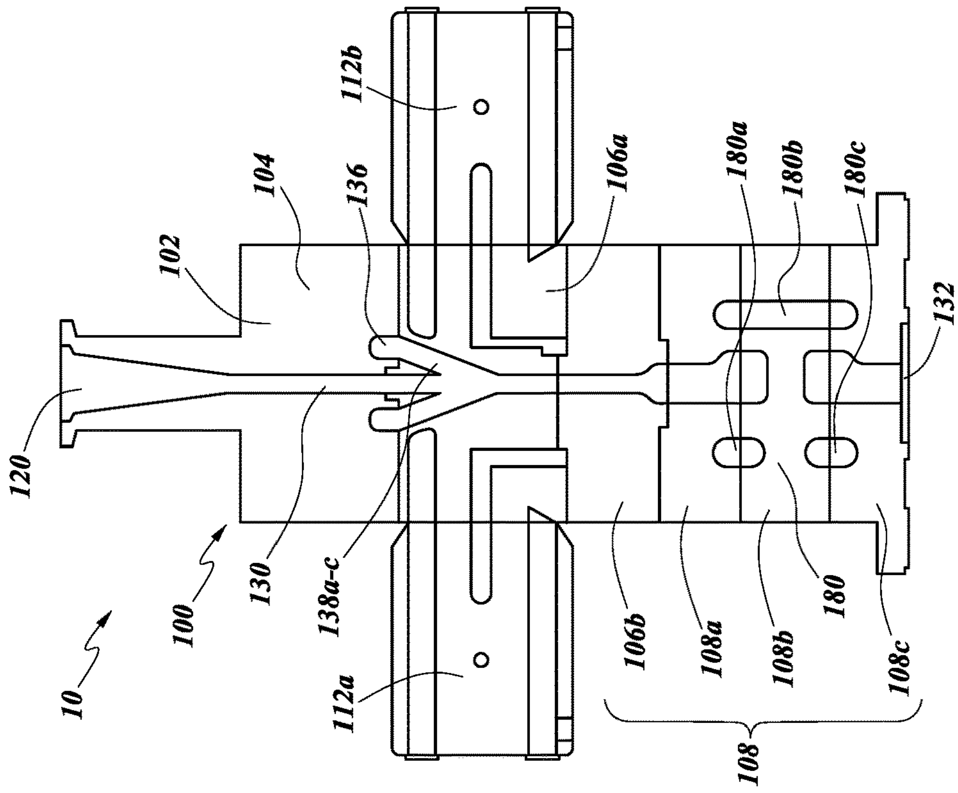
FIG. 2A is a cross sectional view of the semiconductor processing device of FIG. 1.

FIG. 2B is a schematic side sectional view of an improved semiconductor processing device 10 according to one embodiment. Unless otherwise noted, components of FIG. 2B may be generally similar to or the same as like-numbered components of FIG. 2A. For example, the device 10 of FIG. 2B can include a manifold 100 that defines a bore 130 through a manifold body 102. As with FIG. 2A, in the embodiment of FIG. 2B the manifold 100 can be constructed by mounting multiple blocks to one another. For example, as shown in FIG. 2B, an upper block 104 can be mounted to an intermediate block 106. The intermediate block 106 can be mounted to a lower block 108, which can include an outlet 132. As explained herein and in Paragraph [0049] of U.S. Patent Publication No. 2017/0350011 the use of multiple blocks can enable a modular construction of the module, including curved, angled, or other complex geometries. First and second valve blocks 112*a*, 112*b* can also be mounted to the manifold body 102.

Supply lines 138*a*-138*c* can be provided to supply gas from corresponding gas distribution channels to the bore 130. Unlike the embodiment of FIG. 2A, the channels 138A-138*c* of FIG. 2B can be angled upwardly away from the outlet 132 and the downstream reaction chamber relative to their initial entry location in the intermediate block 106. The supply channels 138*a*-138*c* can delimit an acute angle as measured between the supply channels 138*a*-138*c* and the bore 130. The upper ends of the supply channels 138*a*-138*c* can terminate or merge into an impingement surface 214, which may direct the supplied gas(es) downwardly through the bore 130. The impingement surface 214 of FIG. 2B can comprise a curved surface shaped so as to efficiently direct the gases impinging on the surface 214 at an angle back down through the bore 130. In FIG. 2B, the impingement surface 214 and the outlet 132 can be disposed along a linear longitudinal axis of the bore 130. Thus, unlike FIG. 2A in which an inert gas inlet 120 is provided in the upper block 104, in the embodiment of FIG. 2B, the uppermost portion of the upper block 104 is capped, such that the supplied gases, including reactant and inert gases, are provided from the side of the manifold 100.

The bore 130 of the manifold body 102 can deliver reactant and/or inactive gases to a reaction chamber 30 of a reactor 21 by way of the outlet 132 at the bottom of the manifold body 102. A dispersion device 35, such as a showerhead as shown, or a horizontal injection device in other embodiments, can include a plenum 32 in fluid communication with a plurality of openings 19. The reactant vapor can pass through the openings 19 and be supplied into the reaction chamber 30. A substrate support 22 can be configured, or sized and shaped, to support a substrate 36, such as a wafer, within the reaction chamber 30. The dispersed reactant vapor can contact the substrate and react to form a layer (e.g., a monolayer) on the substrate. The dispersion device 35 can disperse the reactant vapor in a manner so as to form a uniform layer on the substrate.

An exhaust line 23 can be in fluid communication with the reaction chamber 30. A vacuum pump 24 can apply suction to the exhaust line 23 to evacuate vapors and excess materials from the reaction chamber 30. The reactor 21 can comprise any suitable type of semiconductor reactor, such as an atomic layer deposition (ALD) device, a chemical vapor deposition (CVD) device, etc. Moreover, the device 10 can comprise a control system 34 in electronic and data communication with the reactor 21. The control system 34 can comprise one or a plurality of processors configured to control the operation of the device 10. Additional components may be provided to manage the operation of the device 10.

Beneficially, the use of the upwardly angled supply channels 138*a*-138*c* and the impingement surface 214 can provide an extended mixing length along which gases can become uniformly mixed. Moreover, the extended mixing length provided by the channels 138*a*-138*c* can reduce the effects of "throw" or spiral/helical flow effect that may result when the curved pathway 180 of FIG. 2A is used, as well as the dead volumes that may result due to the curved and turning channels along the pathway 180. The "throw" effects may also be mitigated by angling only in a vertical plane, for example, instead of angling laterally.

Also, in FIG. 2B, the o-rings 210 of FIGS. 1 and 2A (and called out in FIG. 3A) can be replaced with metallic seals 212 disposed between adjacent blocks. The metallic seals 212 can comprise any suitable type of metallic seal. The metallic seals 212 can be provided at the interfaces between adjacent blocks and can be disposed at least partially about the bore 130, or at least partially about other adjoining passageways or channels, such as supply channels, gas distribution channels, etc. In the illustrated embodiments, the metallic seals 212 comprise C seals, in which the seal comprises a C-shaped toroidal member, with gap or disconnected portion at an outer periphery of the seal. When adjacent blocks are pressed together, the gap can be reduced such that opposing edges of the seal contact one another. Other types of seals may be suitable, including, for example, W seals. The metallic seal 212 can comprise any suitable type of metal, such as steel. The metallic seal 212 can provide an impermeable barrier to inhibit gases from entering or exiting the bore 130 along the block interfaces.

Figure 3B:
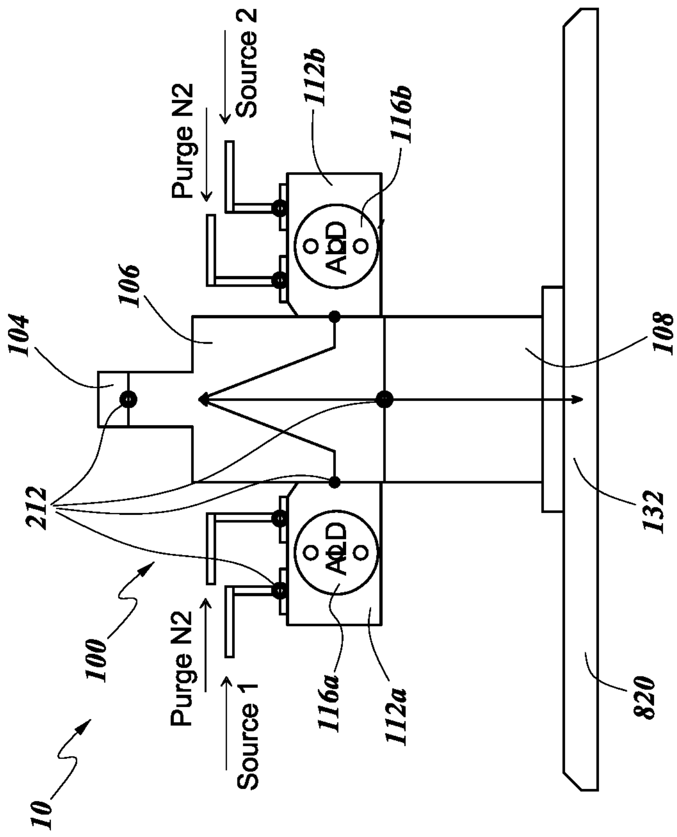
FIG. 3B is a schematic cross sectional view of the semiconductor processing device of FIG. 2B.
Figure 3A:
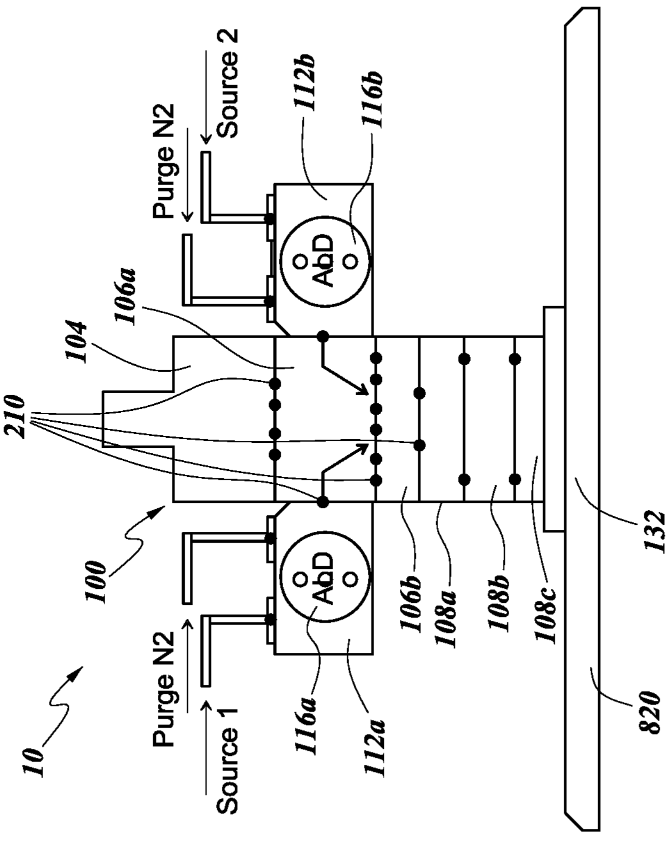
FIG. 3A is a schematic cross sectional view of the semiconductor processing device shown in FIGS. 1 and 2A.

FIG. 3A is a schematic side view showing the approximate location of some of the many o-rings 210 in the device 10 of FIG. 2A at interfaces between the blocks of the manifold tower or body 102 and valve blocks 112*a*, 112*b*. FIG. 3B is a schematic side view showing the approximate locations of metallic rings 212 in the device 10 of FIG. 2B. Unless otherwise noted, the reference numerals of FIGS. 3A-3B represent components that are the same as or generally similar to like-numbered components of FIGS. 2A-2B. FIGS. 3A-3B also illustrate reactant valves 116*a*, 116*b* mounted to the respective valve blocks 112*a*, 112*b*. A gas injector can be provided downstream of and adjacent the outlet 132 of the bore 130 to provide gases to a downstream reaction chamber (not shown) designed to house one or more substrates. In some embodiments, the gas injector can comprise an open volume between the bore 130 of the manifold 100 and the reaction chamber. In some embodiments, a gas dispersion device 820 can be provided between the bore 130 of the manifold 100 and the reaction chamber. In FIG. 3A, such a gas dispersion device comprises a showerhead plenum and showerhead plate. In other arrangements, the manifold could be provided at the side of a chamber, with or without a gas dispersion device to inject the gases into the reaction chamber.

In the arrangement of FIG. 3A, the device 10 includes fourteen (14) o-rings 210. On the manifold tower 100, each dot shows one half of an o-ring 210 for the o-rings 210 provided on the manifold 100; however, the dots shown between the valve blocks 112*a*, 112*b* and the manifold body 102, and between the distribution lines and the valve blocks 112*a*, 112*b*, are shown schematically (not in cross-section). There is an o-ring 210 between the Source 1 line and the valve block 112*a*, between the Source 2 line and the valve block 112*b*, between a first purge line (Purge N2) and the valve block 112*a*, and between a second purge line (Purge N2) and the valve block 112*b*. There is a seal in the form of an o-ring 210 between the first valve block 112*a* and the first intermediate block 106*a*, and between the second valve block 112*b* and the first intermediate block 106*a*. Two (2) o-rings are provided between the upper block 4 and the first intermediate block 106*a*. Three (3) o-rings 210 are provided between the first intermediate block 106*a* and the second intermediate block 106*b*. There is an o-ring between the second intermediate block 106*b* and the first lower block 108*a*, between the first lower block 108*a* and the second lower block 108*b*, and between the second lower block 108*b* and the third lower block 108*c*.

Turning to FIG. 3B, the construction of the manifold 100 can beneficially reduce the number of seals between blocks, so as to simplify the design and improve sealability. For example, in FIG. 3B, only eight (8) seals 212 are used in the manifold 100. For the illustrated embodiment, metallic seals 212 are employed in place of polymeric o-rings. The metallic seals can be o-rings, W-rings or C-rings. As with FIG. 3A, there is a seal 212 between Source 1 and valve block 112*a*, between the Source 2 line and the valve block 112*b*, between the first purge line (Purge N2) and the valve block 112*a*, and between the second purge line (Purge N2) and the valve block 112*b*. One (1) metallic seal 212 is provided between the upper block 104 and the intermediate block 106. One (1) metallic seal 212 is disposed between the intermediate block 106 and the lower block 108. One (1) metallic seal 212 is disposed between the valve block 112*a* and the intermediate block 106, and one (1) metallic seal 212 is disposed between the valve block 112*b* and the intermediate block 106. Accordingly, in the illustrated embodiment, fewer seals can be used as compared with the implementation of FIG. 3A, particularly within or on the manifold tower or body 102.

Figure 4:
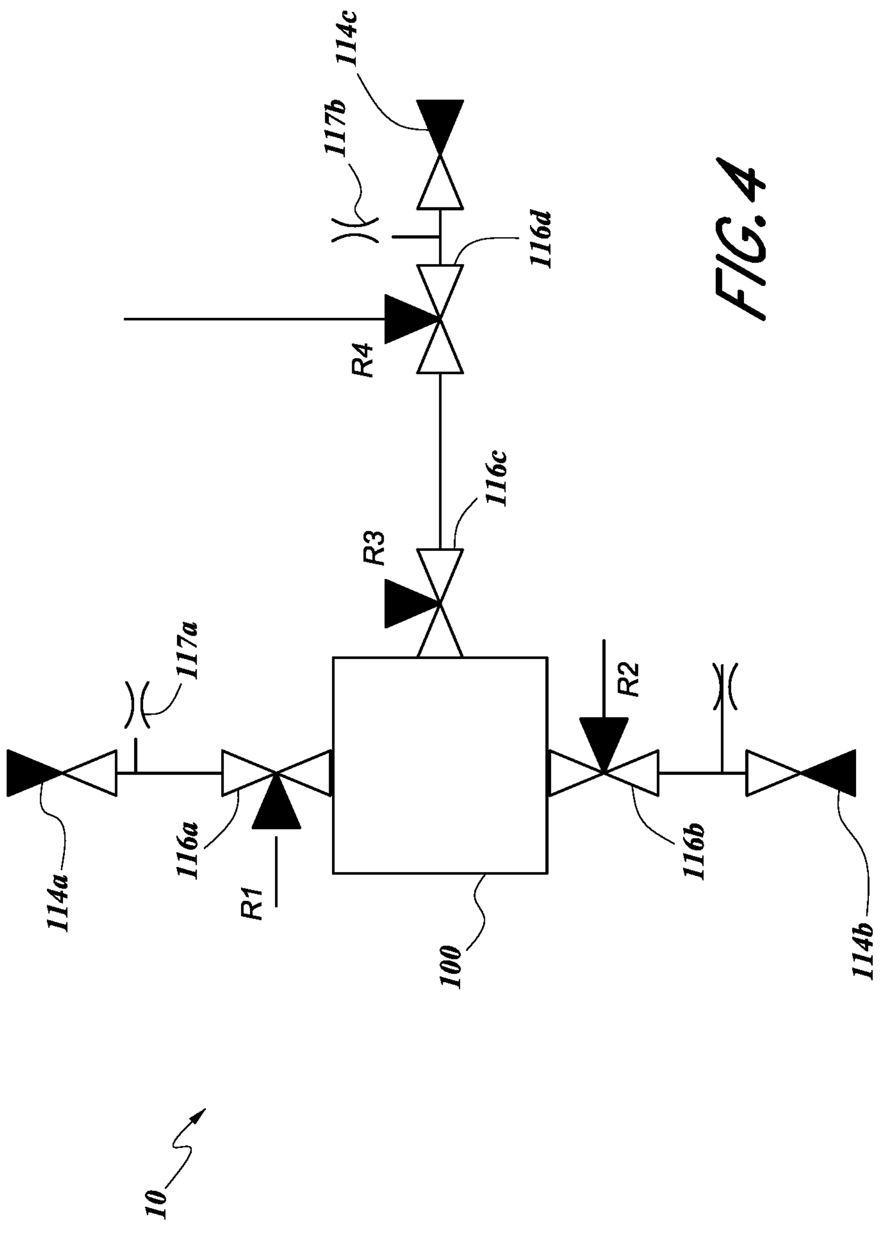
FIG. 4 is a schematic view of the semiconductor processing device of FIG. 2B and 3B illustrating the placement of valves.

FIG. 4 is a schematic system diagram of the device 10 shown in FIGS. 1, 2B and 3B. In the arrangement shown in FIG. 4, four (4) reactant or source gases R1-R4 can be provided sequentially and/or simultaneously, in various combinations, to the manifold 100. For example, the first reactant valve 116*a* (which can be mounted on valve block 112*a*) can be configured to controllably supply a first reactant R1 to the manifold 100. The second reactant valve 116*b* (which can be mounted on valve block 112*b*) can be configured to controllably supply a second reactant R2 to the manifold 100. The third reactant valve 116*c* (which may not be mounted on a dedicated valve block) can be configured to controllably supply a third reactant R3 to the manifold 100. The fourth reactant valve 116*d* (which may not be mounted on a dedicated valve block) can be configured to controllably supply a fourth reactant R4 to the manifold 100. Inert gas valves 114*a*-114*c* can be configured to controllably supply a high flow inert gas along the reactant gas supply lines for purging and/or to serve as a carrier gas for the reactants R1-R4. Restrictors 117*a*-117*b* can be provided to lower the flow of the inert gas from the valves 114a-114c, for example, when the inert gas is to be used as a carrier gas for the respective reactant R1-R4. FIG. 4 represents only one non-limiting valve scheme that can be provided for use with the manifold of FIGS. 2B and 3B.

Additional Embodiments of Semiconductor Processing Devices

During inspection on some reaction chambers 30 after use, white powder has been observed on an upper portion 109 (see FIGS. 7A and 7B) of the manifold body 102 and in gas line(s) near the third reactant valve 116c (which may not be mounted on a dedicated valve block), while no noticeable particles were discovered on the valve blocks 112a, 112b. This white powder may be caused by a response lag between reactant valves 116a, 116b mounted on the valve block 112a, 112b, and the third reactant valve 116c. See FIG. 4. Further, the residue may additionally or alternatively be caused by back diffusion flow of liquid precursors from the valve blocks 112a, 112b as the upper portion 109 of the manifold 100 is not heated in FIGS. 5 and 7A such that cold spots are generated which can cause a pressure drop and liquid precursor condensation. However, adding heating jackets to avoid precursor condensation only covers a partial portion of the line and the response lag may still persist.

Cold spots may cause poor film formation such that deposited films may be delaminated after only a small amount of accumulation. Moreover, diffusion and/or back-flow into the gas lines may result in particle accumulation on the wafer and can cause early chamber failure. The cold spots can be detected on the upper portion 109 which has been measured to be approximately 40° C. lower (depending on temperature set point) compared to the rest of manifold body 102. Accordingly, there remains a continuing need for improved thermal management of semiconductor processing devices. In some embodiments disclosed herein, active heating and/or insulation can be provided on an upper portion 109 of the manifold 100.

Figure 5:
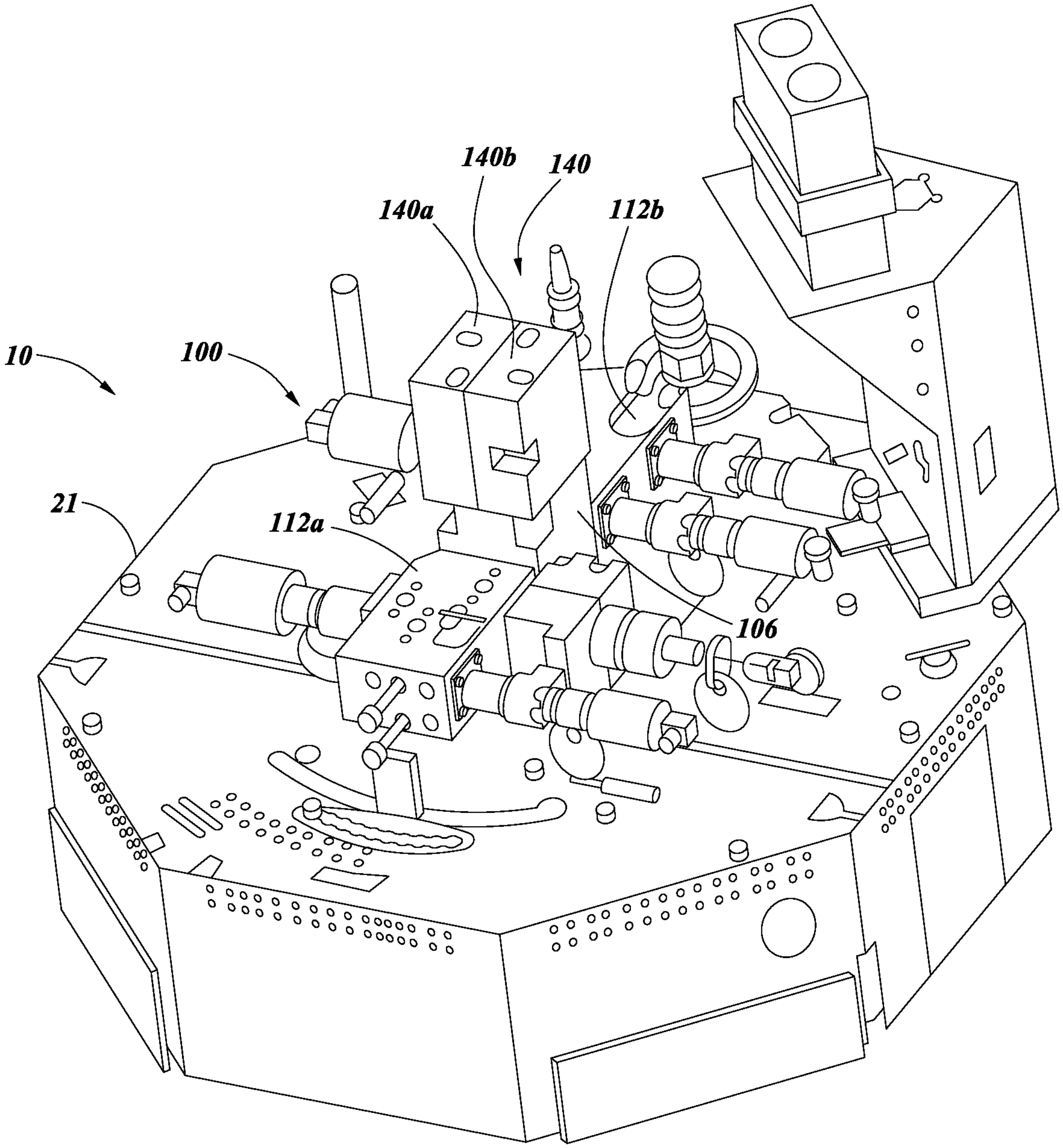
FIG. 5 is a perspective view in accordance with some embodiments of the semiconductor processing device.

Unless otherwise noted, the embodiments of FIGS. 5-9 may include features generally similar to those described above and may operate in a generally similar manner. FIG. 5 is a perspective view of a semiconductor processing device 10. The semiconductor processing device 10 may comprise a manifold 100 comprising a bore 130 configured to deliver a gas to the reaction chamber 21. The manifold 100 may comprise a first block 104 mounted to a second block 106, the first and second blocks cooperating to at least partially define the bore 130. The manifold 100 may further comprise a supply channel 138 that provides fluid communication between a gas source and the bore 130 and an outlet 132 (See FIG. 2B) at a lower portion of the manifold 100 which is in communication with the bore 130. The supply channel 138 may be disposed at least partially in the second block 106. The semiconductor processing device 10 can further comprise an insulator cap 140, which improves the temperature uniformity of manifold body 102. The insulator cap 140 may comprise a thermally insulating material, such as a polymer. For example, the insulator cap 140 can comprise Polytetrafluoroethylene (PTFE) or any other suitable insulating material. In various embodiments, the insulator cap 140 can comprise at least two cap members 140a, 140b configured to be disposed around (e.g., to surround) the first block 104. Beneficially, the insulator cap prevents excess heat loss through the upper portion 109 of the manifold 100, improves film quality, and reduces abnormal film delamination and precursor condensation.

Figure 6:
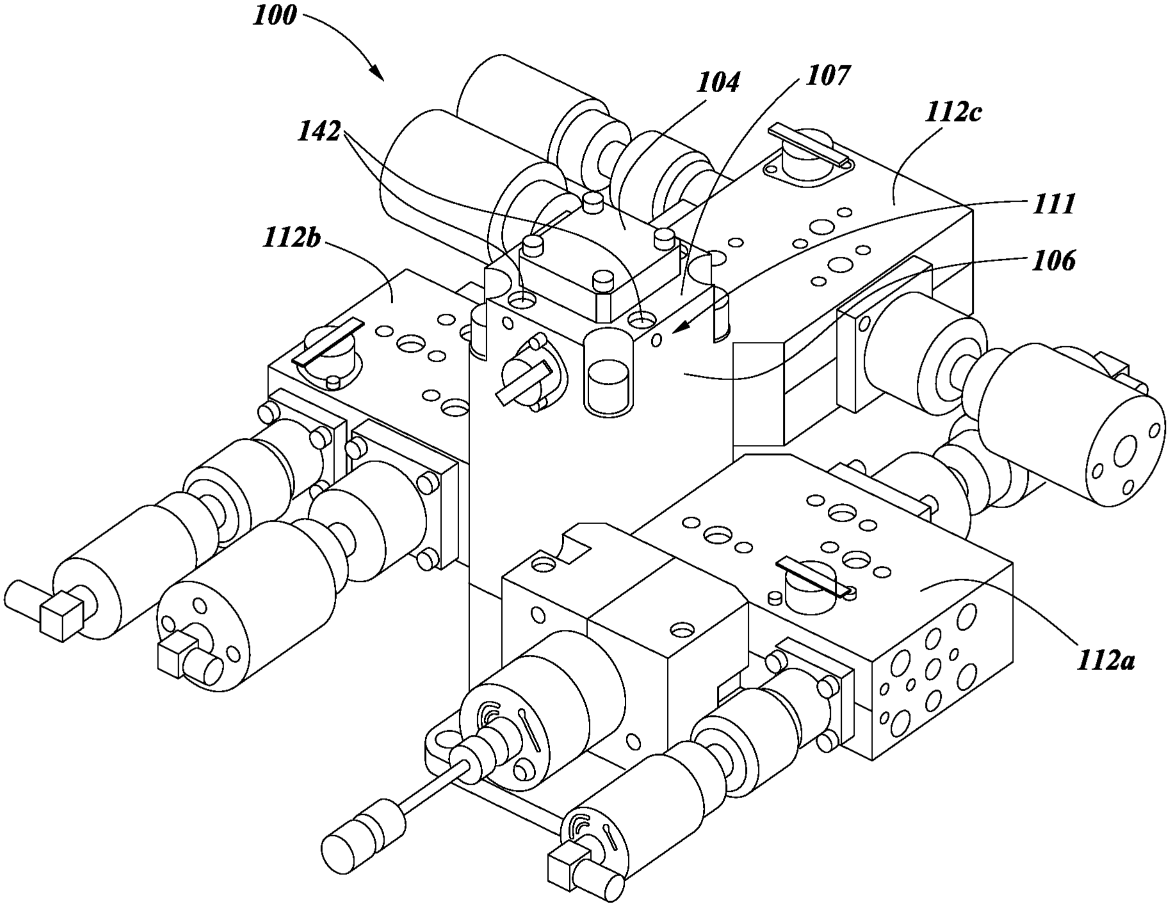
FIG. 6 is a perspective view in accordance with some embodiments of the manifold.
Figure 9:
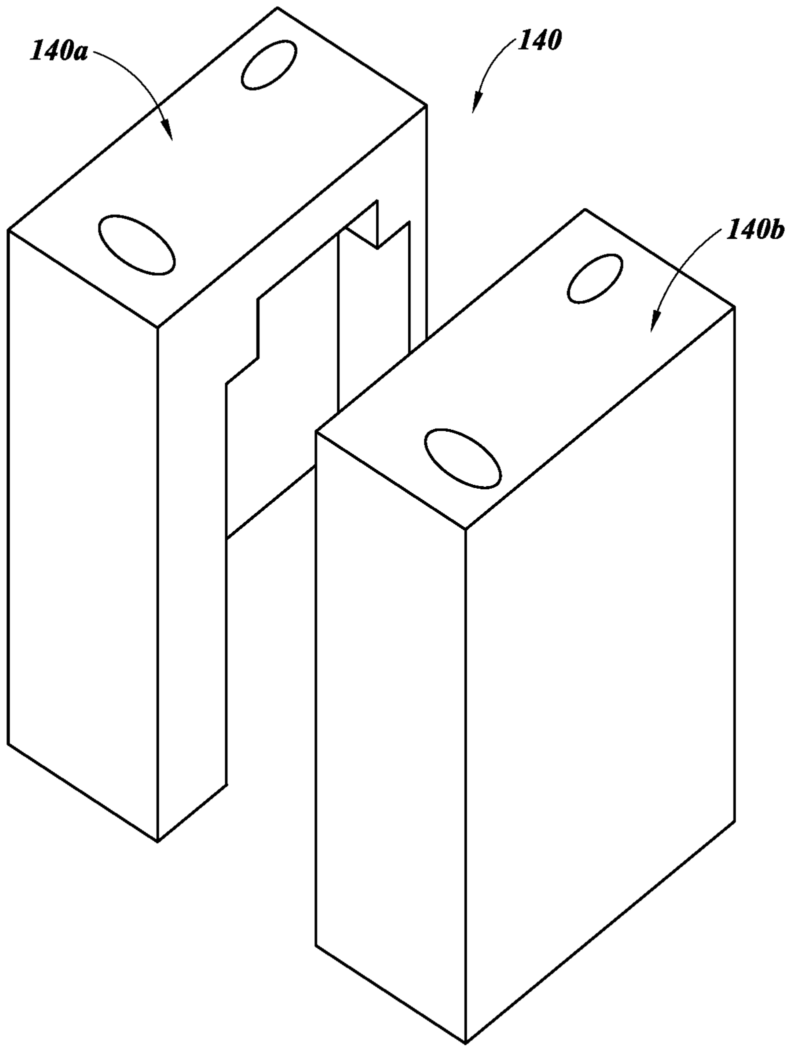
FIG. 9 is a perspective view of the insulator cap in accordance with some embodiments.

As shown in the embodiment of FIG. 9 the insulator cap 140 may comprise a clam shell arrangement in which a first cap member 140a can be coupled to a second cap member 140b by way of connector(s) (e.g., bolts, fasteners, etc.). As shown in FIGS. 5 and 6, the semiconductor processing device 10 may further comprise at least three valve blocks 112a, 112b, 112c, mounted to the second block 106 wherein a reactant valve 116a, 116b and/or inert gas valve 114a, 114b, are mounted to each valve block 112a, 112b.

Further, as shown in FIGS. 7A and 7B, a plurality of heater rods 142 may be arranged in the second block 106. However as indicated in FIGS. 7A and 7B, the plurality of heater rods 142 do not extend all the way to the upper surface 107 of the second block 106, which causes the upper portion 109 of the manifold 100 (including, e.g. the upper portion 109 of the second block 106 and the first block 104) to have cold spots, which causes poor film formation as noted above.

FIG. 6 is a perspective view of a semiconductor processing device 10 which comprises the second block 106 having an extended wall 111, which extends to the upper surface 107 and can be sized to receive heater rods 142 that extend to the upper surface 107. As shown, the semiconductor processing device 10 may comprise at least three valve blocks 112a, 112b, 112c, mounted to the second block 106. The second block 106 having an extending wall 111 may comprise a heater rod 142 arranged in the second block 106. As shown in FIGS. 8A and 8B, the second block may be configured to accommodate the heater rod extending all the way to the upper surface 107 of the second block 106 adjacent the first block 104 to heat the manifold more uniformly. The semiconductor processing device 10 may further comprise a third block 108, with the second block 106 mounted on the third block 108. As shown in FIGS. 6, 8A, and 8B, the heater rod 142 extends through the second 106 and third block 108 to the upper surface 107 of the second block 106. Thus, active heating across the entire manifold 100 is achieved and poor film quality, abnormal film delamination and precursor condensation are prevented.

In order to eliminate the response lag between reactant valves 116a, 116b mounted on the valve block 112a, 112b, and the third reactant valve 116c, as shown in FIG. 6, the semiconductor processing device 10 may comprise at least three valve blocks 112a, 112b, 122c mounted to the second block 106. Each valve block 112a, 112b, 112c, may be mounted to respective side surfaces of the second block 106. As shown, first and second valve blocks 112a, 112b can be mounted on the side surfaces opposite to each other. In various embodiments, the first and second valve blocks 112a, 112b can be located at approximately the same distance from the impingement surface 214 (See FIG. 2B). A third valve block 122c can be provided so that the flow environment among the reactant valves 116a-c are matched and precursor backflow is prevented. The third block 112c can be mounted closer to the impingement surface 214 than the first and second valve blocks 112a, 112b mounted on the side surfaces opposite to each other.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. A semiconductor processing device comprising: a manifold comprising:

a bore configured to deliver a gas to a reaction chamber;

a first block mounted to a second block, the first and second blocks cooperating to at least partially define the bore;

a supply channel that provides fluid communication between a gas source and the bore, the supply channel disposed at least partially in the second block; and an outlet at a lower portion of the manifold and in communication with the bore; and an insulator cap disposed about the first block, the insulator cap comprising a thermally insulating material, wherein the first block comprises an impingement surface at an upper portion of the manifold, the impingement surface shaped to redirect gas downwardly through the bore to the outlet.

2. The semiconductor processing device of claim 1, wherein the insulator cap comprises at least two cap members configured to surround the first block.

3. The semiconductor processing device of claim 1, wherein the insulator cap comprises a polymer.

4. The semiconductor processing device according to claim 1, wherein the supply channel is angled upwardly away from the outlet and inwardly towards the bore.

5. The semiconductor processing device according to claim 1, wherein a plurality of heater rods are arranged in the second block.

6. A semiconductor processing device comprising: a manifold comprising:

a bore configured to deliver a gas to a reaction chamber;

a first block mounted to a second block, the first and second blocks cooperating to at least partially define the bore, the first block disposed about an upper portion of the bore;

an impingement surface in the first block at an upper portion of the manifold, the impingement surface shaped to redirect gas downwardly through the bore to the outlet;

a supply channel that provides fluid communication between a gas source and the bore, the supply channel disposed at least partially in the second block; and an outlet at a lower portion of the manifold, and a heater rod extending through the second block to an upper surface of the second block adjacent the first block.

7. The semiconductor processing device of claim 6, wherein the manifold comprise a plurality of heater rods.

8. The semiconductor processing device of claim 6, further comprising a third block, the second block mounted on the third block, wherein the heater rod extends through the second and third blocks.

9. The semiconductor processing device of claim 6, further comprising at least three valve blocks mounted to the second block, wherein at least one of a reactant gas valve and an inert gas valve are mounted to each valve block.

10. The semiconductor processing device of claim 9, wherein each valve block is mounted to respective side surfaces of the second block.

11. The semiconductor processing device of claim 10, wherein two of the at least three valve blocks are mounted on the side surfaces opposite to each other and are located at a same distance from the impingement surface.

12. The semiconductor processing device of claim 11, wherein one of the at least three valve blocks is mounted closer to the impingement surface than the two of the three valve blocks mounted on the side surfaces opposite to each other.

13. The semiconductor processing device of claim 6, wherein the supply channel is angled upwardly away from the outlet and inwardly towards the bore.

14. A semiconductor processing device comprising: a manifold comprising:

a bore configured to deliver a gas to a reaction chamber; and an impingement surface at an upper portion of the manifold;

an outlet at a lower portion of the manifold; and a supply channel that provides fluid communication between a gas source and the bore: and an insulator cap mounted to the upper portion of the manifold, the insulator cap comprising a thermally insulating material, wherein the supply channel is angled upwardly away from the outlet and inwardly towards the bore, the supply channel oriented to direct gas upwardly towards the impingement surface, and wherein the impingement surface is shaped to redirect gas downwardly through the bore to the outlet.

15. The semiconductor processing device of claim 14 wherein the insulator cap comprises at least two pieces of members configured to surround the upper portion of the manifold.

16. The semiconductor processing device of claim 14, wherein the insulator cap comprises a polymer.

17. The semiconductor processing device of claim 14, wherein a plurality of heater rods are arranged in the manifold.

18. A semiconductor processing device comprising: a manifold comprising:

a bore configured to deliver a gas to a reaction chamber;

a first block mounted to a second block, the first and second blocks cooperating to at least partially define the bore;

a supply channel that provides fluid communication between a gas source and the bore, the supply channel disposed at least partially in the second block;

an outlet at a lower portion of the manifold and in communication with the bore; and an insulator cap disposed about the first block, the insulator cap comprising a thermally insulating material, wherein the supply channel is angled upwardly away from the outlet and inwardly towards the bore.

19. A semiconductor processing device comprising: a manifold comprising:

a bore configured to deliver a gas to a reaction chamber;

a first block mounted to a second block, the first and second blocks cooperating to at least partially define the bore, the first block disposed about an upper portion of the bore;

a supply channel that provides fluid communication between a gas source and the bore, the supply channel disposed at least partially in the second block; and an outlet at a lower portion of the manifold, and a heater rod extending through the second block to an upper surface of the second block adjacent the first block, wherein the supply channel is angled upwardly away from the outlet and inwardly towards the bore.

* * * * *